United States Patent
Yamamichi et al.

(10) Patent No.: US 7,838,779 B2
(45) Date of Patent: Nov. 23, 2010

(54) WIRING BOARD, METHOD FOR MANUFACTURING SAME, AND SEMICONDUCTOR PACKAGE

(75) Inventors: Shintaro Yamamichi, Tokyo (JP); Katsumi Kikuchi, Tokyo (JP); Hideya Murai, Tokyo (JP); Takuo Funaya, Tokyo (JP); Takehiko Maeda, Kanagawa (JP); Kenta Ogawa, Kanagawa (JP); Jun Tsukano, Kanagawa (JP); Hirokazu Honda, Kanagawa (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/452,933

(22) Filed: Jun. 15, 2006

(65) Prior Publication Data

US 2006/0283625 A1    Dec. 21, 2006

(30) Foreign Application Priority Data

Jun. 17, 2005    (JP) .......................... 2005-178415

(51) Int. Cl.
H01R 12/04    (2006.01)
H05K 1/11    (2006.01)
(52) U.S. Cl. .................... 174/264; 174/260; 174/262
(58) Field of Classification Search ............ 174/262, 174/264, 266, 260; 361/792, 793, 794, 795
See application file for complete search history.

(56) References Cited

U.S. PATENT DOCUMENTS

| 3,471,631 | A  | * | 10/1969 | Quintana ................. 174/264 |
| 5,776,662 | A  | * | 7/1998  | Shirai et al. .............. 430/313 |
| 6,013,877 | A  | * | 1/2000  | Degani et al. ............. 174/264 |
| 6,326,559 | B1 | * | 12/2001 | Yoshioka et al. .......... 174/261 |
| 6,418,615 | B1 | * | 7/2002  | Rokugawa et al. ......... 29/852 |
| 6,465,084 | B1 | * | 10/2002 | Curcio et al. ............. 428/209 |
| 6,590,165 | B1 | * | 7/2003  | Takada et al. ............. 174/266 |
| 6,674,017 | B1 | * | 1/2004  | Yamasaki et al. ......... 174/262 |
| 6,753,480 | B2 | * | 6/2004  | Maa et al. ................. 174/255 |
| 6,864,434 | B2 | * | 3/2005  | Chang et al. ............. 174/255 |

FOREIGN PATENT DOCUMENTS

JP    2000-269647 A    9/2000
JP    2002-198462 A    7/2002

OTHER PUBLICATIONS

Toshinori Koyama et al. "Package Having All-Layer Fine-Pitch IVH," Oct. 2001, Proceeding of the 11th Microelectronics Symposium, pp. 131-134.

* cited by examiner

*Primary Examiner*—Ishwar (I. B.) Patel
(74) *Attorney, Agent, or Firm*—Sughrue Mion, PLLC

(57) ABSTRACT

A wiring board in which lower-layer wiring composed of a wiring body and an etching barrier layer is formed in a concave portion formed on one face of a board-insulating film, upper-layer wiring is formed on the other face of the board-insulating film, and the upper-layer wiring and the wiring body of the lower-layer wiring are connected to each other through a via hole formed in the board-insulating film. The via hole is barrel-shaped, bell-shaped, or bellows-shaped.

11 Claims, 12 Drawing Sheets

FIG. 7A
FIG. 7B
FIG. 7C
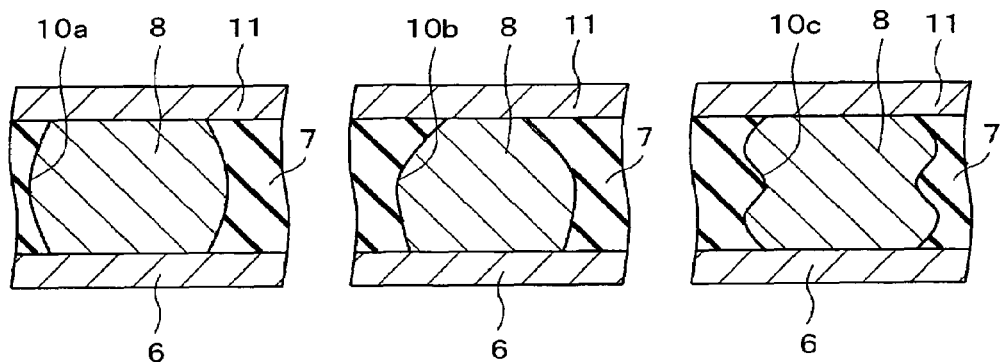
FIG. 8
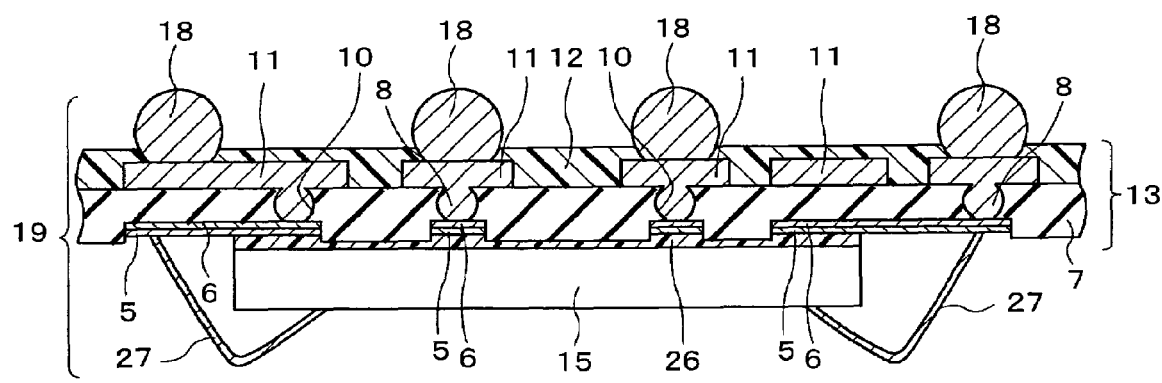

WIRING BOARD, METHOD FOR MANUFACTURING SAME, AND SEMICONDUCTOR PACKAGE

BACKGROUND OF THE INVENTION

1. Field of the Invention

The present invention relates to a wiring board on which semiconductor devices and various other types of devices are mounted, to a method for manufacturing the same, and to a semiconductor package that uses the wiring board.

2. Description of the Related Art

Due to recent advances in the performance and functionality of semiconductor devices, the number of terminals is increasing, the terminals are being spaced apart at a narrower pitch, and processing speed is also increasing. This has led to increased demand for higher-density wiring and higher speed in wiring boards for packaging on which a semiconductor device is mounted. A built-up printed board that is a type of multilayer wiring board is an example of the conventional wiring board for packaging that is commonly used.

FIG. 1 is a sectional view showing the conventional built-up printed board in general use. In the conventional built-up printed board 70 shown in FIG. 1, a base core board 73 composed of glass epoxy is provided, and a penetrating through-hole 71 having a diameter of approximately 300 μm is formed in this base core board 73 by drilling. Conductor wiring 72 is also formed on both faces of the base core board 73, and an interlayer insulating film 75 is provided so as to cover the conductor wiring 72. A via hole 74 is formed in the interlayer insulating film 75 so as to connect to the conductor wiring 72, and conductor wiring 76 is provided on the interlayer insulating film 75 so as to connect to the conductor wiring 72 through the via hole 74. The board is also provided with multilayer wiring as needed by repeatedly forming conductor wiring and an interlayer insulating film in which a via hole is formed to the conductor wiring 76.

However, this built-up printed board 70 has problems in that the use of a glass epoxy printed board in the base core board 73 makes the heat resistance inadequate, and the heat treatment performed in order to form the interlayer insulating film 75 causes shrinkage, warping, swelling, and other deformation of the base core board 73. As a result, in the step for exposing the resist when the semiconductor layer (not shown in the drawing) is patterned and the conductor wiring 76 is formed, the positional accuracy of the exposure is significantly reduced, making it difficult to form a high-density fine-pitch wiring pattern on the interlayer insulating film 75. In order for the penetrating through-hole 71 and the conductor wiring 72 to be reliably connected to each other, a land must be provided to the portion of the conductor wiring 72 that connects to the penetrating through-hole 71. Even when a wiring design adapted for increased speed is adopted in a built-up layer composed of an interlayer insulating film 75 and conductor wiring 76, the presence of the land and the thick penetrating through-hole makes impedance difficult to control, and leads to a large loop inductance. Problems therefore occur in that the operating speed of the built-up printed board as a whole decreases, and the built-up printed board is difficult to adapt for increased speed in a semiconductor device.

Methods for manufacturing a printed board have been proposed to replace the method whereby a drill is used to form a penetrating through-hole in a glass epoxy board. These methods are designed to overcome the types of problems caused by the penetrating through-hole in the built-up printed board (for example, Japanese Laid-open Patent Application No. 2000-269647, and Oyama T. (and three others), "Package Having All-layer Fine-pitch IVH," October 2001, *Proceedings of the 11th Microelectronics Symposium*, pp. 131-134).

FIGS. 2A through 2C are sectional views showing the sequence of steps in the method for manufacturing the built-up printed board disclosed in Japanese Laid-open Patent Application No. 2000-269647. In the conventional method for manufacturing a built-up printed board described in the abovementioned publication, a prepreg 82 is prepared in which a prescribed conductor wiring 81 is formed on the surface, as shown in FIG. 2A. A through-hole 83 having a diameter of 150 to 200 μm is then formed in the prepreg 82 by laser machining. The through-hole 83 is then filled with a conductor paste 84, as shown in FIG. 2B. Then, as shown in FIG. 2C, a plurality of such prepregs 82 are created; specifically, a plurality of prepregs 82 are created in which a through-hole 83 is formed, the through-hole 83 is filled with a conductor paste 84, and the prepregs are layered together. At this time, the land pattern 86 in the conductor wiring 81 is connected to the through-hole 83 of the adjacent prepreg. A built-up printed board 85 that does not have any penetrating through-holes can thereby be created.

However, this conventional technique has problems in that the positional accuracy during layering of the prepregs 82 is low, and it is difficult to reduce the diameter of the land pattern 86. It is therefore difficult to increase the density of the wiring, and the enhancement of impedance control and reduction of loop inductance are inadequate. Furthermore, since the process temperature during layering is limited by the prepreg material, this technique also has problems in that the through-hole connections have poor reliability after layering.

In order to overcome the problems of the conventional wiring board described above, the inventors, et al. have proposed a method for fabricating a wiring board by forming a wiring layer on a metal board or other support body, and then removing a portion of the support body (see Japanese Laid-open Patent Application No. 2002-198462 (pp. 8, 11, and FIG. 17)). FIGS. 3A and 3B are sectional views showing the sequence of steps in the method for manufacturing a wiring board disclosed in Japanese Laid-open Patent Application No. 2002-198462. In the conventional method for manufacturing a wiring board according to this publication, a carrier board 91 composed of a metal board or the like is prepared, as shown in FIG. 3A. Conductor wiring 92 is then formed on this carrier board 91, an interlayer insulating film 93 is formed so as to cover the conductor wiring 92, and a via hole 94 is formed in this interlayer insulating film 93 so as to be connected to the conductor wiring 92. Conductor wiring 95 is then formed on the interlayer insulating film 93. The conductor wiring 95 is formed so as to be connected to the conductor wiring 92 through the via hole 94. The board is also provided with multilayer wiring as needed by repeating the steps for forming the interlayer insulating film 93, the via hole 94, and the conductor wiring 95. Then, as shown in FIG. 3B, a portion of the carrier board 91 is removed by etching, the conductor wiring 92 is exposed, and a support body 96 is formed. A wiring board 97 is thereby manufactured.

According to this technique disclosed in Japanese Laid-open Patent Application No. 2002-198462, the wiring board 97 has no penetrating through-holes at all, eliminating the above-described problems caused by the penetrating through-hole, and allowing a high-speed wiring design to be created. A metal board or the like having excellent heat resistance is also used as the carrier board 91. Therefore, there is no shrinking, warping, swelling, or other deformation such as when a glass epoxy board is used, and higher-density fine-pitch wiring can be created. A wiring board having high strength can also be obtained by specifying the mechanical characteristics of the interlayer insulating film 93 as described above.

However, the aforementioned conventional technique has the problems described below. Semiconductor devices are mounted at high density in conjunction with recent remarkable advances in performance and multi-function capability in mobile devices and the like. A technique called system-in-package (SiP) has recently gained attention as a technique for implementing a plurality of semiconductor devices on a single wiring board. In order to obtain increased reliability in this SiP-type semiconductor package using a conventional wiring board, it is preferred that the via diameter, which is the contact surface between the upper and lower wiring and the via, be increased as much as possible, that electrical conduction be maintained, and that the mechanical bonding strength of the wiring be enhanced. However, when the via diameter is increased, the diameter of the land that is in contact with the via must also be increased for reasons relating to the alignment precision in the manufacturing steps. When, for example, the minimum line width of the wiring is set, problems occur in that the number of wires running between lands decreases, and setbacks occur in the process of increasing the wiring density. Moreover, the via diameter and the land diameter of wiring boards tend to decrease each year in conjunction with increased multifunction capability in semiconductor devices, which is less favorable for the reliability of wiring connections.

Photo vias and laser vias are two types of via holes commonly formed in wiring boards. A photo via is patterned by a process in which a photosensitive resin is used as an interlayer insulating film, the photosensitive resin is irradiated with ultraviolet rays through a glass mask, and exposure and development are performed. A laser via is formed by using laser ablation to thermally remove the interlayer insulating film that corresponds to the via portion. In either case, the usual process produces a via opening that has a cylindrical shape or a conical shape in which the diameter of the opening is larger on the light-exposed surface or the laser-irradiated surface. However, this type of cylindrical or conical via shape has problems in that thermal stress occurs between the wiring material and the insulating resin, which have different thermal expansion coefficients, during the heat cycle test that is one of the reliability tests. As a result, interface peeling of Cu as a typical wiring conductor occurs at the interface between the via and the wiring, and particularly at the interface between the lower-layer wiring and the bottom of a via having a small-diameter opening, and an open-circuit failure occurs. This defect becomes particularly severe in a micro-via in which the diameter of the opening at the bottom of the via is less than 80 μm, and the aspect ratio calculated based on the diameter of the opening at the bottom of the via and the thickness of the insulating resin is 1 or higher.

These problems are caused by the difference in thermal expansion coefficient between the wiring material and the insulating resin, as previously mentioned. Another contributing factor is the small surface area of contact between the conductor in the via and the interlayer insulating film on the lateral face of the via. Problems also occur when the wiring board is abruptly subjected to an excessive acceleration, such as in a drop impact test, in that peeling occurs in the bottom portion of the via where the bonding strength is low. The reason for this is that when the via shape is cylindrical or conical, it is difficult in terms of shape to prevent the via conductor from peeling off and separating from the via bottom when an outside force is exerted in the direction from the via bottom, where the opening diameter is small, to the via top, where the opening diameter is large.

Compared to a common conventional built-up board provided with a thick core member having a penetrating through-hole, these problems are especially severe in a novel coreless-type wiring board in which a core member is not provided, such as the wiring boards disclosed in Japanese Laid-open Patent Application No. 2002-198462 and Oyama T. (and three others), "Package Having All-layer Fine-pitch IVH," Oct. 2001, *Proceedings of the 11$^{th}$ Microelectronics Symposium,* pp. 131-134, due to the board's extremely thin profile. In the common conventional built-up board, the thickness of the core member makes the board sturdy, and almost no warping occurs. However, warping easily occurs in a coreless-type conventional wiring board due to the temperature history of the heat treatment step during board manufacturing and due to the vertically asymmetrical structure of the wiring board. Concentration of stress at the bottom of the via is also sometimes accelerated depending on the shape of the warp.

SUMMARY OF THE INVENTION

An object of the present invention is to provide a highly reliable wiring board that is effective for increasing the number of terminals and reducing the pitch between terminals required for increased integration, increased speed, or increased multifunction capability of a semiconductor device, to provide a method for manufacturing the same, and to provide a semiconductor package.

The wiring board according to a first aspect of the present invention has a board-insulating film which has a thickness of 20 to 100 μm and in which a concave portion is formed on one face thereof, first wiring formed in the concave portion of the board-insulating film, second wiring formed on the other face of the board-insulating film, and a via hole for connecting the second wiring and the first wiring formed on the board-insulating film to each other, wherein the cross-section of the via hole in the thickness direction of the board-insulating film is barrel-shaped.

The wiring board according to a second aspect of the present invention has a board-insulating film which has a thickness of 20 to 100 μm and in which a concave portion is formed on one face thereof, first wiring formed in the concave portion of the board-insulating film, second wiring formed on the other face of the board-insulating film, and a via hole for connecting the second wiring and the first wiring formed on the board-insulating film to each other, wherein the cross-section of the via hole in the thickness direction of the board-insulating film is bell-shaped.

The wiring board according to a third aspect of the present invention has a board-insulating film which has a thickness of 20 to 100 μm and in which a concave portion is formed on one face thereof, first wiring formed in the concave portion of the board-insulating film, second wiring formed on the other face of the board-insulating film, and a via hole for connecting the second wiring and the first wiring formed on the board-insulating film to each other, wherein the cross-section of the via hole in the thickness direction of the board-insulating film is bellows-shaped.

In the wiring board according to the first through third aspects of the present invention, the via hole has a barrel shape in which the cross-sectional area of the middle portion is larger than the cross sectional area of the end portions, or has a bell shape or a bellows shape as a modification of the barrel shape. Therefore, the total area of contact between the internal conductor filled into the via hole and the insulating film that constitutes the lateral face of the via hole is increased, and the mechanical bonding strength can also be increased. A wiring board can thereby be obtained that has excellent reliability with respect to the assembly process, thermal stress in the service environment, impact resistance, and other characteristics, and that is effective for increasing the number of terminals and reducing the pitch between terminals required for increased integration, increased speed, or increased multifunction capability of a semiconductor device.

The board-insulating film may have a layered structure in which a plurality of insulating films are layered, intermediate wiring may be formed between each of the insulating films, and the wirings formed in the upper layer and the lower layer of the insulating films may be connected to each other by the via hole formed in the insulating films.

The connection interface of two wirings connected to each other through the via hole may be in the center portion of the via hole in the thickness direction of the board-insulating film. Since this configuration makes it possible to increase the cross-sectional area of the connected portions of the upper and lower wirings, the adhesion strength between the wirings can be further increased.

A 0.5 to 10-μm stepped portion may be formed between the surface of the first wiring and one face of the board-insulating film. Alternatively, the surface of the first wiring and one face of the board-insulating film may be positioned in the same plane. When these surfaces are positioned in the same plane, a configuration may be adopted in which a protective film is formed on the first wiring and on one face of the board-insulating film, an open portion is provided to at least part of the portion of the protective film that is formed on the first wiring, and the surface of the first wiring is exposed in the open portion.

A solder resist layer may be formed on the second wiring and on the other face of the board-insulating film, an open portion may be provided to at least part of the portion of the solder resist layer that is formed on the second wiring, and the surface of the second wiring may be exposed in the open portion.

Furthermore, a concave portion may be formed also on the other face of the board-insulating film, and the second wiring may be formed in this concave portion.

According to a fourth aspect of the present invention, there is provided a method for manufacturing a wiring board having a board-insulating film which has a thickness of 20 to 100 μm and in which a concave portion is formed on one face thereof, first wiring formed in the concave portion of the board-insulating film, second wiring formed on the other face of the board-insulating film, and a via hole for connecting the second wiring and the first wiring formed on the board-insulating film to each other, wherein the method for manufacturing a wiring board comprises the steps of imparting a barrel shape, a bell shape, or a bellows shape to the cross-section of the via hole in the thickness direction of the board-insulating film by desmearing a portion of the board-insulating film using a chemical solution.

In the present invention, the cross-section of the via hole in the thickness direction of the board-insulating film is given a barrel shape, a bell shape, or a bellows shape by desmearing a portion of the board-insulating film using a chemical. Therefore, a via hole having this type of cross-sectional shape can easily be formed.

The semiconductor package according to a fifth aspect of the present invention has the aforementioned wiring board and one or a plurality of semiconductor devices mounted on this wiring board.

The aforementioned semiconductor device may be connected to the first wiring of the wiring board. The semiconductor device may also be connected to the second wiring of the wiring board. The semiconductor package may also have a connection terminal connected to an external element and to the first or second wiring.

According to the present invention, the via hole is bell-shaped, bellows-shaped, or barrel-shaped, wherein the cross-sectional area of the middle portion in the thickness direction is larger than the cross sectional area of the end portions. Therefore, excellent reliability can be obtained even when the degree of integration, speed, and multifunction capability of the semiconductor device is increased.

BRIEF DESCRIPTION OF THE DRAWINGS

FIGS. 6A through 6C are sectional views showing the sequence of steps in the method for manufacturing a wiring board according to the first embodiment of the present invention, wherein FIG. 6A shows the step subsequent to that of FIG. 5C;

FIGS. 7A through 7C are magnified sectional views showing the shape of the via hole;

FIG. 8 is a sectional view showing the semiconductor package according to a second embodiment of the present invention;

DESCRIPTION OF THE PREFERRED EMBODIMENTS

Figure 1:
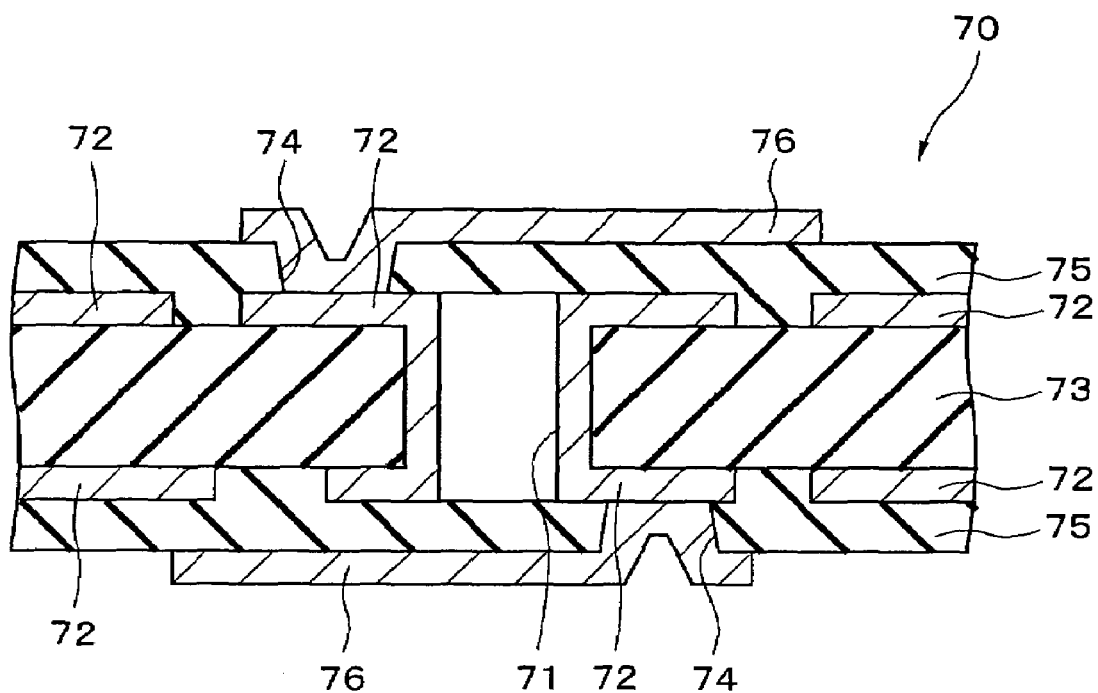
FIG. 1 is a sectional view of a conventional built-up printed board in common use.
Figure 2A:
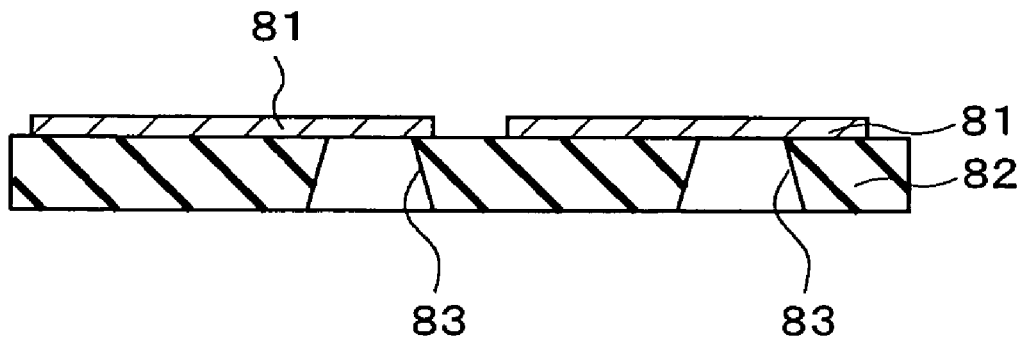
FIGS. 2A through 2C are sectional views showing the sequence of steps in the method for manufacturing a built-up printed board disclosed in Japanese Laid-open Patent Application No. 2000-269647.
Figure 2B:
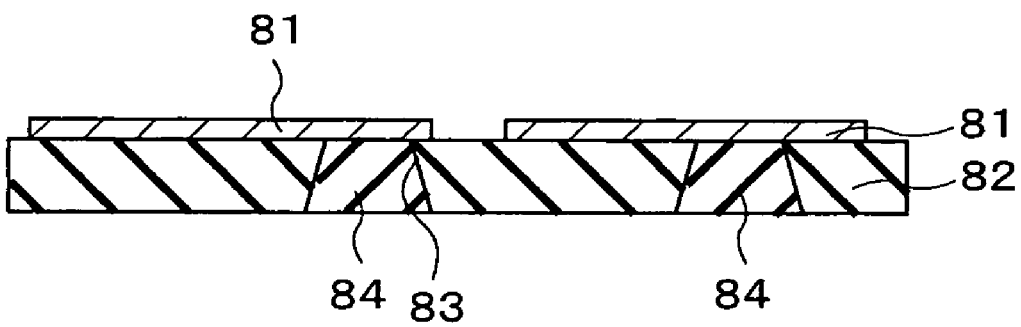
Figure 2C:
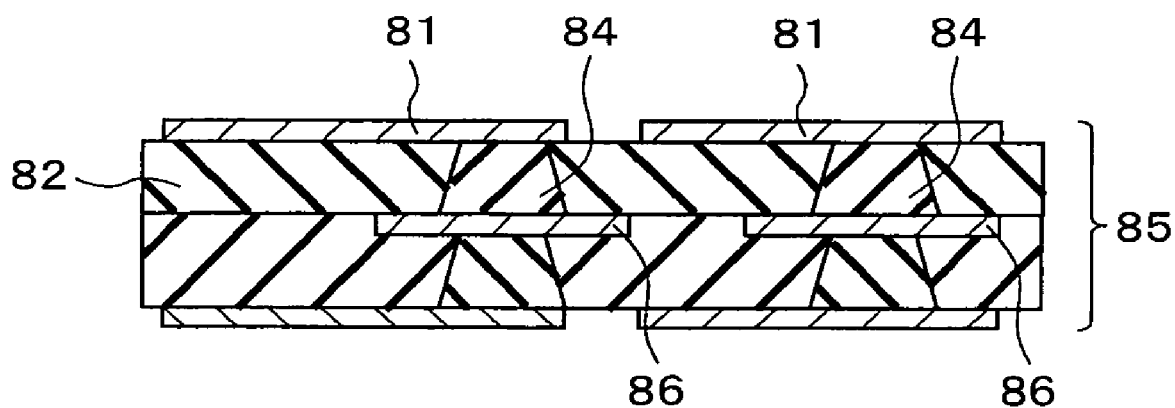
Figure 3A:
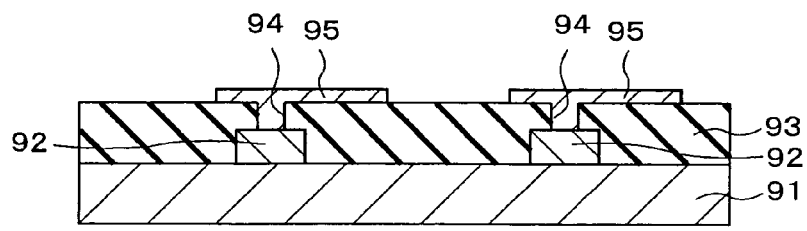
FIGS. 3A and 3B are sectional views showing the sequence of steps in the method for manufacturing a wiring board disclosed in Japanese Laid-open Patent Application No. 2002-198462.
Figure 3B:
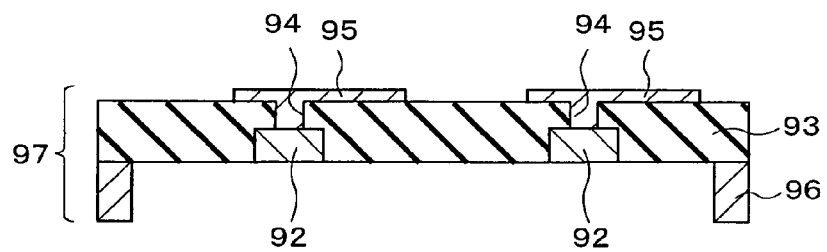
Figure 4:
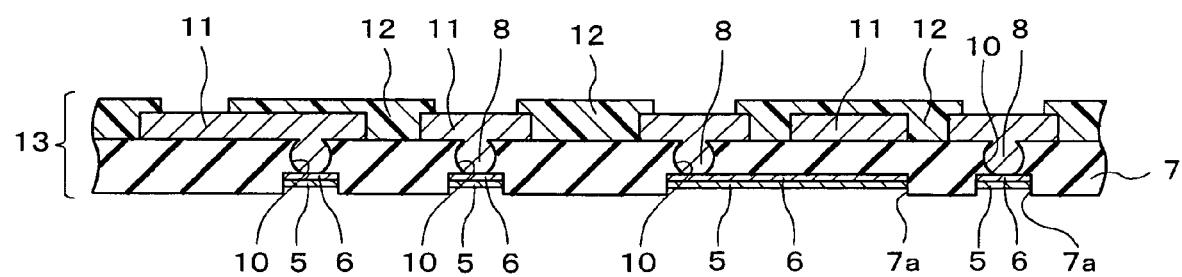
FIG. 4 is a sectional view showing the wiring board according to a first embodiment of the present invention.

Embodiments of the present invention will be described in detail hereinafter with reference to the accompanying drawings. The wiring board according to a first embodiment of the present invention will first be described. FIG. 4 is a sectional view showing the wiring board according to the present embodiment. As shown in FIG. 4, a board-insulating film 7 in which a plurality of concave portions 7a are formed in one face (the lower face) is provided to the wiring board 13 of the present embodiment. A wiring body 6 is formed in the concave portions 7a of the board-insulating film 7, and an etching barrier 5 is formed on the wiring body 6. The etching barrier 5 and wiring body 6 form the lower-layer wiring. Specifically, the lower-layer wiring is formed in the concave portions 7a provided to the board-insulating film 7. The surface of the etching barrier 5 in this lower-layer wiring is exposed, and this surface constitutes a portion of the lower face of the wiring board 13. The wiring body 6 in the wiring board 13 of the present embodiment may be formed from Cu, Ni, Au, Al, Pd, or the like, for example, and has a film thickness of 2 to 20 µm, for example. The etching barrier 5 may be formed from Ni, Au, Pd, or the like, for example, and has a film thickness of 0.1 to 7.0 µm, for example. Furthermore, the surface of the etching barrier 5 is in a position that is about 0.5 to 10 µm higher, for example, than one face (the lower face) of the board-insulating film 7, i.e., in a position that is recessed into the concave portion 7a.

A via hole 10 is formed in a portion of each area directly above the concave portions 7a in the board-insulating film 7. When the wiring board 13 is used in a chip-size semiconductor package (Chip Size Package: CSP), the maximum diameter of the via hole 10 is 75 µm, for example. When the wiring board 13 is used in a flip-chip ball-grid array (FCBGA) semiconductor package, the maximum diameter of the via hole 10 is 40 µm, for example. Rather than having a cylindrical or conical shape such as in a conventional wiring board, the via hole 10 has a barrel shape in which the cross-section that is perpendicular to the thickness direction of the board-insulating film 7 is larger in the middle than at the ends. The via hole 10 is filled with an internal conductor 8 composed of a conductive material.

Upper-layer wiring 11 is formed on the other face (upper face) of the board-insulating film 7 so as to be in contact with the internal conductor 8. The upper-layer wiring 11 may also be integrally formed with the internal conductor 8 in the via hole 10. The upper-layer wiring 11 has a film thickness of 2 to 20 µm, for example, and is connected to the wiring body 6 through the internal conductor 8 in the via hole 10. Furthermore, a solder resist layer 12 is formed on the other face (upper face) of the board-insulating film 7 so that a portion of the upper-layer wiring 11, i.e., the portion that will become the pad electrode, is exposed, and the remaining area is covered. The solder resist layer 12 has a film thickness of 5 to 40 µm, for example.

In the wiring board 13 of the present embodiment, since the via hole 10 has a barrel shape, the surface area of contact between the internal conductor 8 in this via hole 10 and the board-insulating film 7 constituting the lateral face of the via hole 10 is increased, and the mechanical bonding strength can be increased. The wiring can thereby be prevented from losing contact due to separation of the conductor at the bottom of the via hole 10 during heat cycle testing, and tensile stress in the longitudinal direction of the via hole 10 can also be relieved during drop impact testing. As a result, a wiring board can be obtained that has excellent reliability with respect to the assembly process, thermal stress in the service environment, impact resistance, and other characteristics, and that is effective for increasing the number of terminals and reducing the pitch between terminals required for increased integration, increased speed, or increased multifunction capability of a semiconductor device.

Figure 5A:
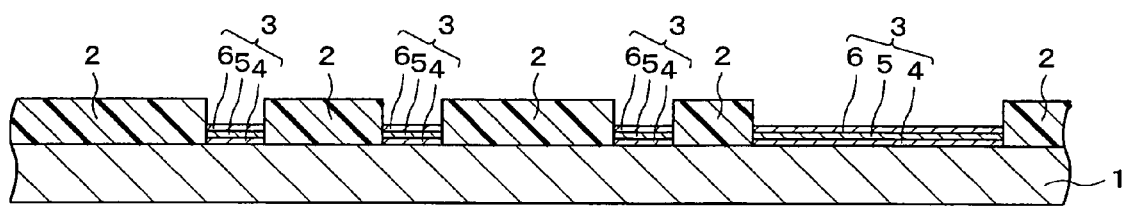
FIGS. 5A through 5C are sectional views showing the sequence of steps in the method for manufacturing a wiring board according to the first embodiment of the present invention.

The method for manufacturing the wiring board 13 of the present embodiment will next be described. FIGS. 5A through 5C and 6A through 6C are sectional views showing the sequence of steps in the method for manufacturing the wiring board 13 of the present embodiment. First, a carrier board 1 composed of Cu or another metal or an alloy thereof, for example, is prepared, and a resist pattern 2 is formed on one face of this carrier board 1, as shown in FIG. 5A. A readily etchable layer 4, an etching barrier layer 5, and a wiring body 6 are then formed in this sequence on one face of the carrier board 1 by plating or the like, for example. At this time, a conductor wiring layer 3 composed of the readily etchable layer 4, etching barrier layer 5, and wiring body 6 is formed only in the area in which the resist pattern 2 is not formed on one face of the carrier board 1, and the conductor wiring layer 3 is not formed in the area in which the resist pattern 2 is formed.

The readily etchable layer 4 in the conductor wiring layer 3 may be formed from a single plating layer of Cu, a two-layer plating layer composed of a Cu layer and a Ni layer, or a single plating layer of Ni, for example; and the thickness thereof is 0.5 to 10 µm, for example. By making the readily etchable layer 4 into a two-layer plating layer composed of a Cu layer and a Ni layer as described above, and providing the Ni layer on the side of the etching barrier layer 5, it is possible to prevent diffusion from occurring between the Cu layer of the readily etchable layer 4 and the etching barrier layer 5 at high temperatures. The thickness of the Ni layer in the readily etchable layer 4 in this case is preferably 0.1 µm or greater, for example. The etching barrier layer 5 may be a plating layer composed of Ni, Au, or Pd, for example, and may have a thickness of 0.1 to 7.0 µm, for example. The wiring body 6 may also be a plating layer composed of Cu, Ni, Au, Al, Pd, or the like, for example, and may have a thickness of 2 to 20 µm, for example. When the etching barrier layer 5 is formed from Au, and the wiring body 6 is formed from Cu, a Ni layer may be provided between the etching barrier layer 5 and the wiring body 6 in order to prevent diffusion of these elements.

Figure 5B:
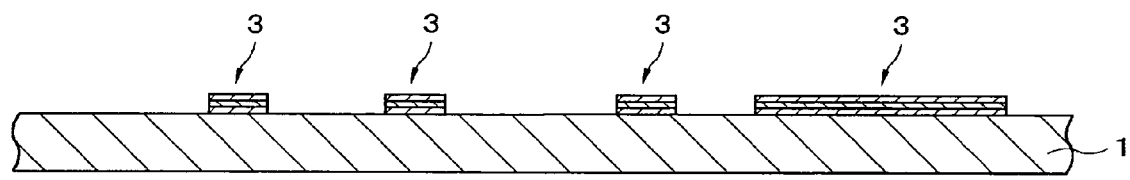
Figure 5C:
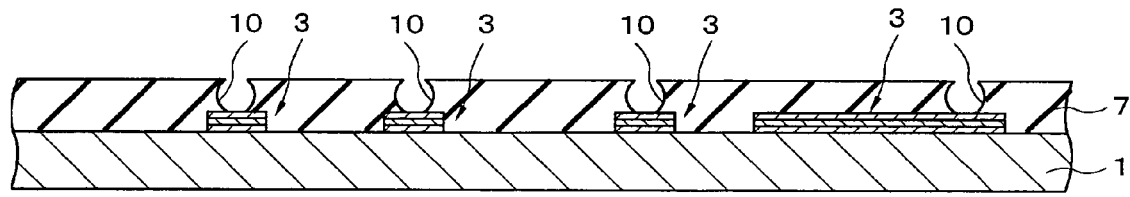

The resist pattern 2 is then removed, as shown in FIG. 5B. Then, as shown in FIG. 5C, a board-insulating film 7 is formed on one face of the carrier board 1 so as to cover the conductor wiring layer 3. This board-insulating film 7 may be formed by laminating the carrier board 1 with a sheet of insulating film, or by affixing the insulating film to the carrier board 1 by a pressing method, heat-treating the product at a temperature of 100 to 400° C., for example, sustained for 10 minutes to 2 hours, and curing the insulating film, for example. During this process, the temperature and duration of heat treatment are appropriately adjusted according to the type of insulating film used. The via hole 10 is then formed in the board-insulating film 7 by laser machining in a portion of the area directly above the conductor wiring layer 3. A desmear treatment using a potassium permanganate solution or the like, for example, is generally performed in order to remove the insulating film residue at the bottom when the via hole is formed. However, in the method for manufacturing the wiring board of the present embodiment, a cylindrical hole (via hole) is first formed, the concentration of the chemical solution and the treatment time are adjusted when the desmear treatment is performed, the lateral face of the middle portion in the thickness direction of the board-insulating film 7 is caused to recede in the transverse direction by over-etching the insulating film more in the inside than at the ends in this cylindrical hole, and a barrel-type via hole is formed.

Figure 6A:
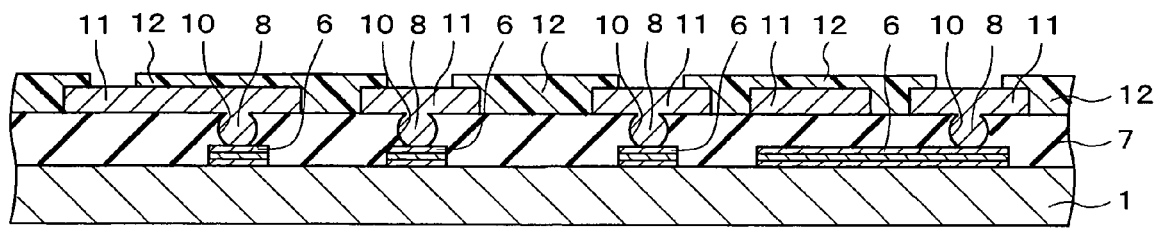

Then, as shown in FIG. 6A, the via hole 10 is filled with an internal conductor 8 composed of a conductive material, and upper-layer wiring 11 is formed on the board-insulating film 7. The upper-layer wiring 11 is thereby connected to the wiring body 6 through the internal conductor 8 filled into the via hole 10. The upper-layer wiring 11 and the internal conductor 8 filled into the via hole 10 may be formed from a plating layer composed of Cu, Ni, Au, Al, Pd, or another conductor, for example. In cases in which the internal conductor 8 and the upper-layer wiring 11 are integrally formed by Cu electroplating, the connection interface between the upper-layer wiring 11 and the wiring body 6 is placed at the substantial bottom end of the via hole 10 when the Cu electroplating is performed after first forming an extremely thin Cu electroless plating layer having a thickness of 1 µm or less. On the other hand, the connection interface between the upper-layer wiring 11 and the wiring body 6 is placed near the middle of the via hole 10 when a Cu electroplating layer is deposited on the wiring body 6, which is the lower-layer wiring exposed in the portion where the via hole 10 is formed, the via hole 10 is approximately halfway filled, and then upper-layer wiring 11 composed of a Cu electroless plating layer and a Cu electroplating layer is formed. Then, a solder resist layer 12 having a thickness of 5 to 40 µm, for example, is formed on the board-insulating film 7 as needed so as to expose a portion of the upper-layer wiring 11, i.e., the portion that will become the pad electrode, for example, and to cover the other portions.

Figure 6B:
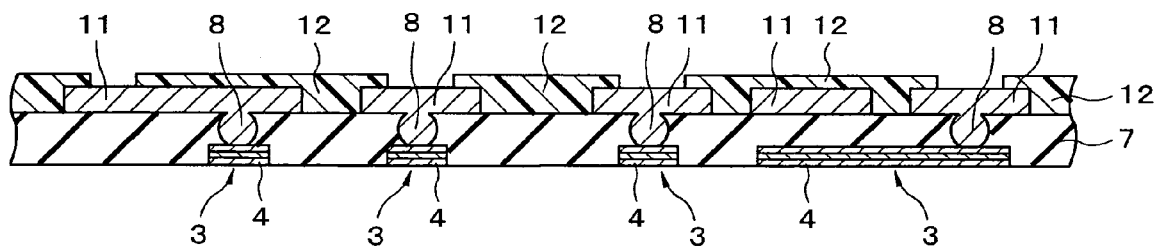
Figure 6C:
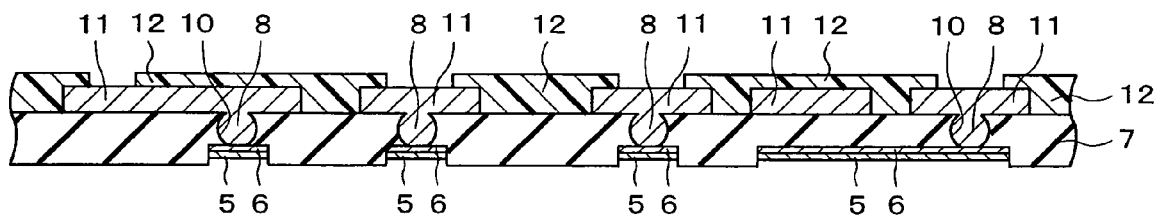

Then, as shown in FIG. 6B, the carrier board 1 is removed by chemical etching, polishing, or the like. The readily etchable layer 4 is then removed by etching, and the etching barrier layer 5 is exposed, as shown in FIG. 6C. The wiring board 13 shown in FIG. 4 is thereby obtained. In this instance, when the material used to form the carrier board 1 is different from the material used to form the readily etchable layer 4, it becomes necessary to have two etching steps as described above. However, when the carrier board 1 and the readily etchable layer 4 are both formed from the same material, the etching steps shown in FIGS. 6B and 6C may be performed simultaneously.

In the method for manufacturing a wiring board according to the present embodiment, a conductor wiring layer 3, a board-insulating film 7, upper-layer wiring 11, and other components are formed on a rigid carrier board 1 composed of Cu or another metal or an alloy thereof, for example. Therefore, a wiring board 13 with a high degree of flatness can be created.

In the method for manufacturing a wiring board according to the present embodiment, a carrier board 1 composed of a metal or metal alloy is used, but the present invention is not limited to this configuration, and a board composed of a silicon wafer, glass, a ceramic, a resin, or another insulator may be used. When a board composed of an insulator is used in this manner, it is sufficient if a conductor wiring layer 3 is formed by an electroless plating method after a resist pattern 2 is formed, or if the conductor wiring layer 3 is formed by electroplating after a power conductor layer is formed by electroless plating, sputtering, vapor deposition, or another method.

In the wiring board according to the first embodiment described above, a barrel-shaped via hole 10 is formed, but the present invention is not limited to this configuration, and the via hole may be bell-shaped or bellows-shaped. FIGS. 7A through 7C are magnified sectional views of the shape of the via hole. Among these via holes, the bell-shaped via hole 10b shown in FIG. 7B may be formed by first forming a hole shaped as a truncated cone, and then performing over-etching or the like on the lateral face in the transverse direction when the desmear treatment is performed, in the same manner as in the barrel-shaped via hole shown in FIG. 7A. The bellows-shaped via hole 10c shown in FIG. 7C can be formed by forming the board-insulating film 7 from a plurality of layers having different desmear resistance properties or behaving differently with respect to jetted solutions of chemicals.

Compared to the simple cylindrical shape and truncated cone shape of the via hole in the conventional wiring board, the surface area of contact between the internal conductor filled into the via hole and the board-insulating film 7 constituting the lateral face of the via hole is also increased in all of the via hole shapes that include the barrel-type shape shown in FIG. 7A, the bell shape shown in FIG. 7B, and the bellows shape shown in FIG. 7C. The adhesion strength between the internal conductor 8 and the board-insulating film 7 can therefore be increased. The lateral face is also formed by a curved surface in all of the via hole shapes shown in FIGS. 7A through 7C. Therefore, the stress is mitigated by the board-insulating film 7 that is present above and below the maximum-diameter portion, i.e., in the periphery of the ends of the via hole, even when the board-insulating film 7 is formed from an insulating resin having a high coefficient of thermal expansion, the board-insulating film 7 expands at the high temperature maintained during heat cycle testing, and force is exerted in the direction in which the internal conductor 8 in the via hole, the upper-layer wiring 11, and the wiring body 6 peel apart from each other at the interface thereof. A satisfactory connection can therefore be maintained.

Furthermore, the maximum-diameter portion is formed in the middle in the barrel-shaped via hole 10a shown in FIG. 7A and the bell-shaped via hole 10b shown in FIG. 7B. Therefore, stress in the direction in which the internal conductor 8 separates from the via holes 10a and 10b can be suppressed during drop impact testing even when an external force is exerted in the direction from the small-diameter end of the via hole to the large-diameter middle portion of the via hole. The lateral face has an irregular complex shape in the case of the bellows-shaped via hole 10c shown in FIG. 7C. Therefore, the adhesion strength between the internal conductor 8 and the board-insulating film 7 in this shape is the strongest among the three types of shapes having the same diameter, and the stress-mitigating effects during drop impact testing are also the greatest in this shape. A high degree of reliability is therefore obtained. However, the manufacturing process can be designed so that a board-insulating film 7 composed of one type of material can be formed by etching in the barrel-shaped via hole and the bell-shaped via hole as described above. Therefore, these shapes are preferred from the perspective of manufacturing cost. From another perspective, a barrel shape and a bellows shape, in which the diameter of the opening on both ends of the via hole can be made smaller than the diameter (maximum diameter) of the middle portion, have superior wiring accommodation properties in comparison with a bell shape in terms of adaptation to decreased pitch in the wiring interval and increased pin count in the semiconductor device.

Furthermore, in the wiring board 13 of the present embodiment, the upper-layer wiring 11 and the internal conductor 8 filled into the via hole 10 are not integrally formed. For example, the wiring body 6 of the lower-layer wiring and the upper-layer wiring 11 may be connected to each other at the middle portion of the via hole 10. When the internal conductor 8 and the upper-layer wiring 11 are integrally formed, the upper-layer wiring 11 and the wiring body 6 are connected to each other at the bottom of the via hole 10 where the opening diameter and cross-sectional area are small. Therefore, the adhesion in the connection interface between these two components is always a concern. However, the via hole 10 is shaped as a barrel, bell, or bellows as shown-in FIGS. 7A, 7B, and 7C, respectively, and a portion of the wiring body 6, which is the lower-layer wiring, is shaped so as to extend into the via hole 10 to allow the upper-layer wiring 11 and the wiring body 6 to be connected to each other in or around the position in which the cross-sectional area in the thickness direction is largest. The surface area of the connection interface between the upper-layer wiring 11 and the wiring body 6 can thereby be increased. The adhesion between the upper-layer wiring 11 and the wiring body 6 can therefore be enhanced. When it is difficult to form a portion of the wiring body 6 so as to extend into the via hole 10 when the wiring body 6 is formed, a portion of the internal conductor 8 may first be formed inside the via hole 10 by a method that produces strong adhesion, and then the upper-layer wiring 11 and the remaining internal conductor 8 may be integrally formed by a multi-purpose method. Specifically, when the upper-layer wiring 11 and the wiring body 6 are formed from Cu, for example, Cu electroplating having strong adhesion with respect to the board-insulating film 7 is first performed in the area directly below the via hole 10 on the surface of the wiring body 6, i.e., in the area exposed by the via hole 10, and a portion of the internal conductor 8 is formed in the bottom of the via hole 10, i.e., in the portion on the side of the wiring body 6. Then, Cu electroless plating is performed according to the usual method, and an electroplated Cu coating is formed as a power supply layer, whereby the remaining internal conductor 8 and the upper-layer wiring 11 are integrally formed.

Furthermore, when a material in which aramid fibers or a glass cloth is impregnated into a resin is used as the board-insulating film 7, the aramid fibers and glass cloth may protrude towards the inside from the lateral face of the via hole 10 when the portion of the via hole 10 formed from a resin is in a shape such as any of the shapes shown in FIGS. 7A through 7C. By having a portion of the insulating material that constitutes the board-insulating film 7 protruding in this manner, the surface area of contact between the internal conductor 8 and the board-insulating film 7 is further increased and reliability is enhanced.

The semiconductor package according to a second embodiment of the present invention will next be described. FIG. 8 is a sectional view showing the semiconductor package of the present embodiment. In FIG. 8, the same reference symbols are used to indicate constituent elements that are the same as those in the wiring board 13 of the first embodiment shown in FIG. 4, and detailed description thereof is omitted. As shown in FIG. 8, in the semiconductor package 19 of the present embodiment, an LSI (Large Scale Integrated circuit) or other semiconductor device 15, for example, is mounted on the wiring board 13 shown in FIG. 4. Specifically, the semiconductor device 15 is positioned via a mounting member 26 on the bottom face of the wiring board 13, and an electrode (not shown in the drawing) of this semiconductor device 15 and a prescribed position on the etching barrier layer 5 are connected to each other by a wire 27.

A solder ball 18 is disposed on the exposed portion; specifically, on the pad electrode portion, of the upper-layer wiring 11 in the wiring board 13. The solder ball 18 is connected to an electrode of the semiconductor device 15 via the upper-layer wiring 11, the internal conductor 8 formed inside the via hole 10, the lower-layer wiring composed of the wiring body 6 and the etching barrier layer 5, and the wire 27. This semiconductor package 19 is mounted to a mounting board (not shown in the drawing) via the solder ball 18. In the semiconductor package 19 of the present embodiment, the via hole 10 of the wiring board 13 has a barrel shape in which the cross-sectional area in the thickness direction is larger in the middle portion than at both ends.

In the semiconductor package 19 of the present embodiment, a wiring board 13 is used that is provided with a via hole shaped so that the cross-sectional area in the thickness direction is larger in the middle portion than at both ends. Therefore, excellent reliability can be obtained even when the degree of integration, the speed, and the multifunction capability of the semiconductor device are increased.

Figure 9:
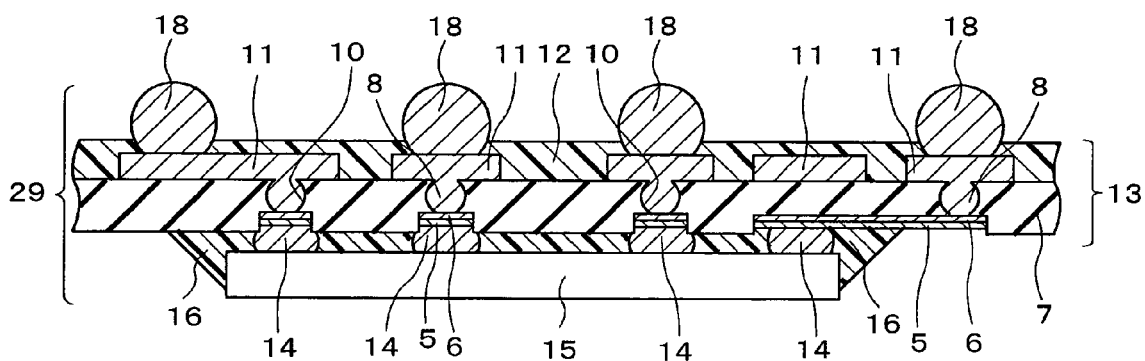
FIG. 9 is a sectional view showing the semiconductor package according to a first modification of the second embodiment of the present invention.

The semiconductor package according to a first modification of the second embodiment of the present invention will next be described. FIG. 9 is a sectional view showing the semiconductor package according to the present modification. In FIG. 9, the same reference symbols are used to indicate constituent elements that are the same as those in the semiconductor package of the second embodiment shown in FIG. 8, and detailed description thereof is omitted. In the semiconductor package 19 of the previously described second embodiment, the semiconductor device 15 is mounted to the wiring board 13 by wire bonding, but the present invention is not limited to this configuration, and a flip-chip method, a tape automated bonding method, and various other mounting methods may be used. As shown in FIG. 9, in the semiconductor package 29 of the present modification, an LSI or other semiconductor device 15, for example, is mounted on the bottom face of the wiring board 13 by a flip-chip method.

Specifically, a bump 14 is disposed on each etching barrier layer 5 of the wiring board 13, and the etching barrier layer 5 of the wiring board 13 and an electrode (not shown in the drawing) provided to the semiconductor device 15 are connected to each other via this bump 14. An underfill 16 is filled around the bump 14 in the space between the wiring board 13 and the semiconductor device 15. A solder ball 18 is disposed on the exposed portion, specifically, on a portion of the pad electrode, of the upper-layer wiring 11 of the wiring board 13. This solder ball 18 is connected to an electrode of the semiconductor device 15 via the upper-layer wiring 11, the internal conductor 8 formed inside the via hole 10, the lower-layer wiring composed of the wiring body 6 and the etching barrier layer 5, and the bump 14. This semiconductor package 29 is mounted to a mounting board (not shown in the drawing) via the solder ball 18. In the semiconductor package 29 of the present modification, the via hole 10 of the wiring board 13 is shaped as a barrel in which the cross-sectional area in the thickness direction is larger in the middle portion than at both ends. Aspects of the configuration of the semiconductor package 29 of the present modification other than those described above are the same as in the semiconductor package 19 of the previously described second embodiment.

In the semiconductor package 29 of the present modification, a wiring board 13 is used that is provided with a via hole shaped so that the cross-sectional area in the thickness direction is larger in the middle portion than at both ends. Therefore, excellent reliability can also be obtained in the same manner as in the semiconductor package 19 of the previously described second embodiment even when the degree of integration, the speed, and the multifunction capability of the semiconductor device are increased in a case in which the semiconductor device 15 is mounted to the wiring board 13 by a flip-chip method.

Figure 10A:
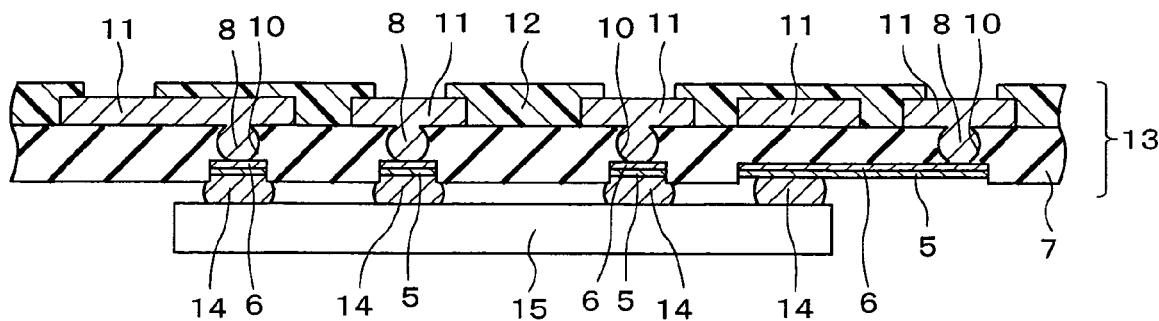
FIGS. 10A and 10B are sectional views showing the sequence of steps in the method for manufacturing the semiconductor package according to the first modification of the second embodiment of the present invention.
Figure 10B:
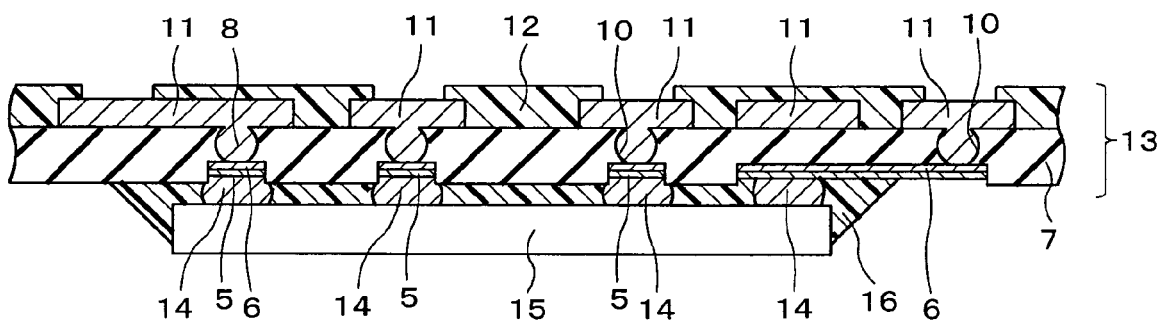
Figure 10C:
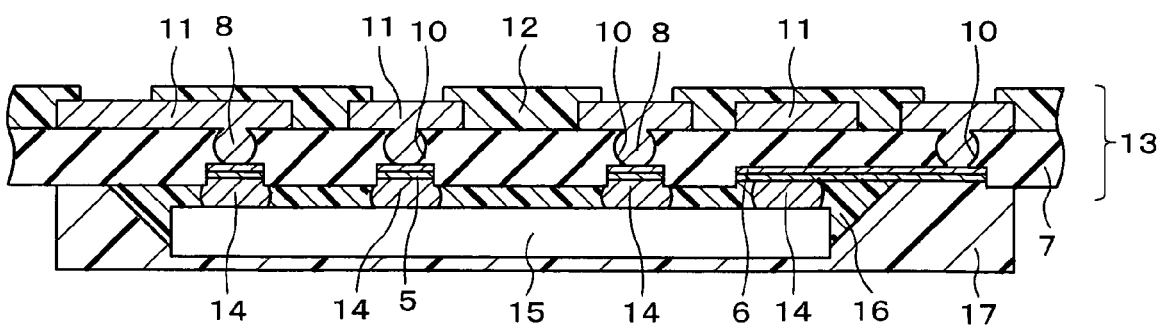
FIG. 10C is a sectional view showing the step for further molding the semiconductor package according to the first modification of the second embodiment of the present invention.

The method for manufacturing the semiconductor package 29 of the present modification will next be described. FIGS. 10A and 10B are sectional views showing the sequence of steps in the method for manufacturing a semiconductor package according to the present modification. FIG. 10C is a sectional view showing the step for further molding the semiconductor package of the present modification. In the method for manufacturing a semiconductor package according to the present modification, a bump 14 is first bonded to the surface of each etching barrier layer 5, as shown in FIG. 10A. The semiconductor device 15 is then mounted on the bottom face of the wiring board 13 via this bump 14 by a flip-chip method. At this time, the electrode (not shown in the drawing) of the semiconductor device 15 is connected to the bump 14. Then, as shown in FIG. 10B, an underfill 16 is filled into the space between the wiring board 13 and the semiconductor device 15, and the underfill 16 is then solidified. The bump 14 is thereby embedded in the underfill 16. The solder ball 18 is then mounted on the exposed portion of the upper-layer wiring 11 in the wiring board 13, and the semiconductor package 29 shown in FIG. 9 is created.

In the method for manufacturing a semiconductor package according to the present modification, the step for forming the underfill 16 shown in FIG. 10B may be omitted. As shown in FIG. 10C, an appropriate molding 17 may also be formed so as to cover the underfill 16 and the semiconductor device 15 on the bottom face of the wiring board 13.

Figure 11:
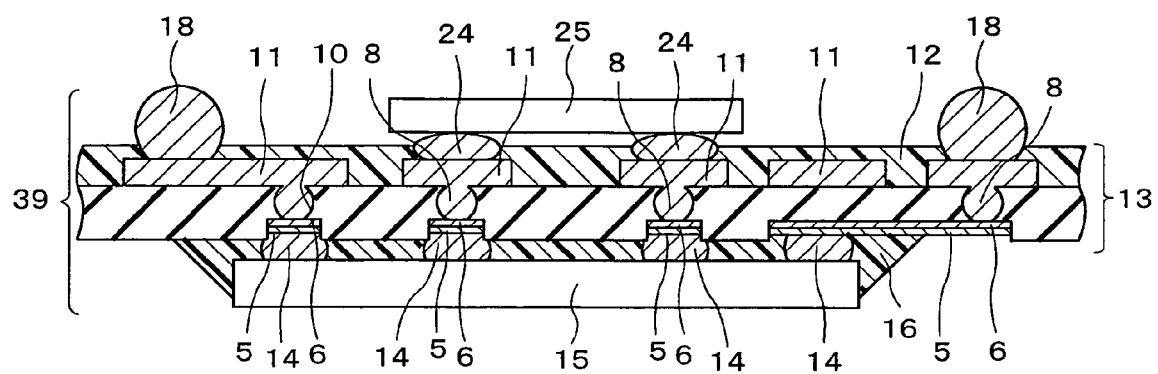
FIG. 11 is a sectional view showing the semiconductor package according to a second modification of the second embodiment of the present invention.

The semiconductor package according to a second modification of the second embodiment of the present invention will next be described. FIG. 11 is a sectional view showing the semiconductor package of the present modification. In FIG. 11, the same reference symbols are used to indicate constituent elements that are the same as those in the semiconductor package of the second embodiment shown in FIG. 8, and detailed description thereof is omitted. As shown in FIG. 11, a semiconductor device is mounted to both faces of the wiring board 13 in the semiconductor package 39 of the present modification. Specifically, besides the semiconductor device 15 connected to the lower-layer wiring (wiring body 6 and etching barrier layer 5) via the bump 14, a semiconductor device 25 is connected to the upper-layer wiring 11 via a bump 24. A portion of an electrode (not shown in the drawing) of the semiconductor device 15 is connected to an electrode (not shown in the drawing) of the semiconductor device 25 via the bump 14, the lower-layer wiring composed of the etching barrier layer 5 and wiring body 6, the internal conductor 8 inside the via hole 10, the upper-layer wiring 11, and the bump 24. In the semiconductor package 39 of the present modification, the via hole 10 of the wiring board 13 has a barrel shape in which the cross-sectional area in the thickness direction is greater in the middle portion than at the ends thereof. Aspects of the configuration of the semiconductor package 39 of the present modification other than those described above are the same as in the semiconductor package 19 of the previously described second embodiment.

In the semiconductor package 39 of the present modification, a semiconductor device is mounted to both faces of the wiring board 13, and a plurality of semiconductor devices can therefore be mounted to a single wiring board 13. As a result, a higher degree of integration of semiconductor devices can be achieved, and multiple types of semiconductor devices can be mounted.

The via hole of the wiring board is shaped as a barrel in the semiconductor package of the previously described second embodiment and modifications thereof. However, the present invention is not limited to this configuration, and the via hole of the wiring board may have the bell shape shown in FIG. 7B or the bellows shape shown in FIG. 7C, and the same effects are obtained using these shapes as are obtained when the via hole is barrel-shaped.

Figure 12:
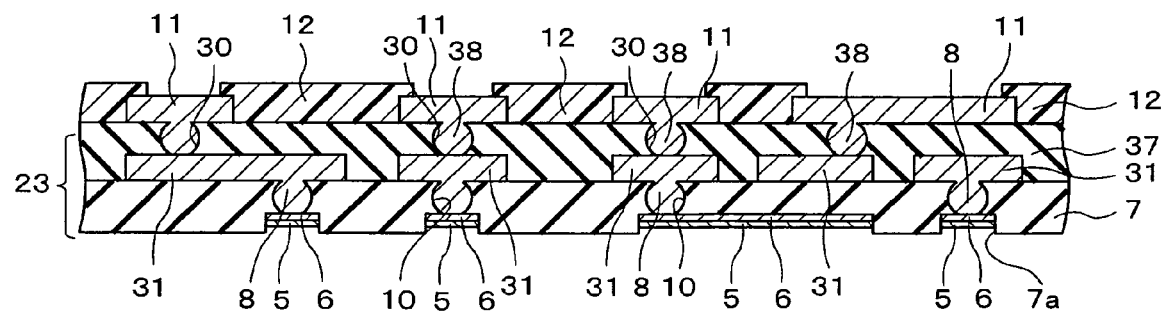
FIG. 12 is a sectional view showing the wiring board according to a third embodiment of the present invention.

The wiring board according to a third embodiment of the present invention will next be described. FIG. 12 is a sectional view showing the wiring board of the present embodiment. In FIG. 12, the same reference symbols are used to indicate constituent elements that are the same as those in the wiring board 13 of the first embodiment shown in FIG. 4, and detailed description thereof is omitted. As shown in FIG. 12, the wiring board 23 of the present embodiment is provided with a board-insulating film 7 in which a plurality of concave portions 7a are formed on one face (the bottom face) thereof. A wiring body 6 is formed in the concave portions 7a of the board-insulating film 7, and an etching barrier layer 5 is formed on the wiring body 6. The etching barrier 5 and wiring body 6 constitute the lower-layer wiring. Specifically, the lower-layer wiring is formed in the concave portions 7a provided to the board-insulating film 7. Other aspects of the configurations of the etching barrier layer 5 and wiring body 6 are the same as in the semiconductor device 15 of the previously described first embodiment.

A via hole 10 is formed in a portion of each area directly above the concave portions 7a in the board-insulating film 7, and an internal conductor 8 composed of a conductive material is filled into the via hole 10. Intermediate wiring 31 is furthermore formed on the board-insulating film 7. This intermediate wiring 31 is formed integrally with the internal conductor 8 in the via hole 10, for example, and the intermediate wiring 31 and the wiring body 6 are connected to each other by the internal conductor 8. An intermediate insulating film 37 is furthermore formed on the board-insulating film 7 so as to cover the intermediate wiring 31, and a via hole 30 is formed in a portion of the area directly above the intermediate wiring 31 in the intermediate insulating film 37. The via hole 30 is filled with an internal conductor 38 composed of a conductive material. Upper-layer wiring 11 is formed on the intermediate insulating film 37; the upper-layer wiring 11 and the internal conductor 38 in the via hole 30, for example, are integrally formed; and the upper-layer wiring 11 and the wiring body 6 of the lower-layer wiring are connected to each other by the internal conductor 38 of the via hole 30. The via hole 10 and the via hole 30 in the wiring board 23 of the present embodiment have a barrel shape in which the cross-sectional area in the thickness direction is larger in the middle portion than at both ends.

Furthermore, a solder resist layer 12 is formed on the intermediate insulating film 37 so that a portion of the upper-layer wiring 11, i.e., the portion that serves as the pad electrode, is exposed, and the remaining area is covered. The film thickness and mechanical characteristics of the intermediate insulating film 37 are preferably the same as the film thickness and mechanical characteristics of the board-insulating film 7, but the film thickness and mechanical characteristics may also be made different from those of the board-insulating film 7 as needed. Aspects of the configuration of the wiring board 23 of the present embodiment other than those described above are the same as in the wiring board of the previously described first embodiment.

In the wiring board 23 of the present embodiment, the insulating film has a two-layer structure composed of the board-insulating film 7 and the intermediate insulating film 37, and intermediate wiring 31 can be provided between these insulating films. Therefore, the number of signals inputted to and outputted from a mounted semiconductor device can be further increased in comparison with the wiring board of the aforementioned first embodiment. Effects in the wiring board 23 of the present embodiment other than those described above are the same as those of the wiring board of the aforementioned first embodiment.

The wiring board 23 of the present embodiment is provided with a two-layer insulating film composed of the board-insulating film 7 and the intermediate insulating film 37, but the present invention is not limited to this configuration, and an insulating film having three or more layers may be provided to the wiring board, in which case the same effects are obtained as in the present embodiment. The via hole is also not limited to being barrel-shaped and may also be bell-shaped or bellows-shaped. The intermediate wiring 31 and the internal conductor 8 inside the via hole 10, and/or the upper-layer wiring 11 and the internal conductor 38 inside the via hole 30 are also not necessarily integrally formed, and the upper and lower wirings may be connected to each other in the middle portion of the via hole 10 and/or the via hole 30. Furthermore, when the board-insulating film 7 and/or the intermediate insulating film 37 are formed from a material in which aramid fibers or glass cloth is impregnated into a resin, the aramid fibers and glass cloth may protrude towards the inside from the lateral face of the via hole 10 when the portion of the via hole 10 formed from a resin is in a shape such as any of those shown in FIGS. 7A through 7C.

Figure 13:
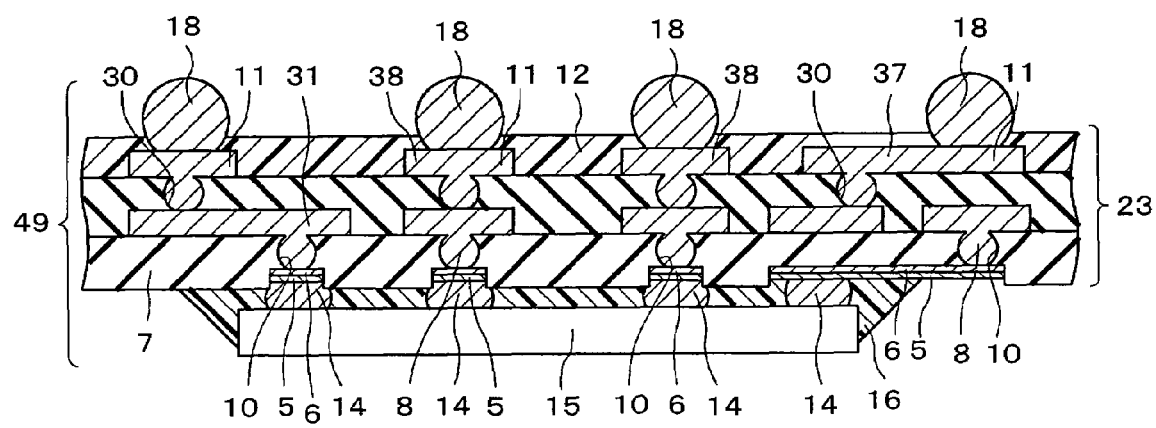
FIG. 13 is a sectional view showing the semiconductor package according to a fourth embodiment of the present invention.

The semiconductor package according to a fourth embodiment of the present invention will next be described. FIG. 13 is a sectional view showing the semiconductor package of the present embodiment. In FIG. 13, the same reference symbols are used to indicate constituent elements that are the same as those in the semiconductor package 19 of the second embodiment shown in FIG. 8 and the wiring board 23 of the third embodiment shown in FIG. 12, and detailed description thereof is omitted. As shown in FIG. 13, in the semiconductor package 49 of the present embodiment, an LSI or other semiconductor device 15 is mounted on the bottom face of the wiring board 23 of the previously described third embodiment. Specifically, a bump 14 is disposed on each etching barrier layer 5 of the wiring board 23, and the etching barrier layer 5 of the wiring board 23 and an electrode (not shown in the drawing) provided to the semiconductor device 15 are connected to each other via this bump 14. An underfill 16 is filled around the bump 14 in the space between the wiring board 23 and the semiconductor device 15.

A solder ball 18 is mounted on the exposed portion, specifically, on a portion of the pad electrode, in the upper-layer wiring 11 of the wiring board 23. The solder ball 18 is connected to an electrode of the semiconductor device 15 via the upper-layer wiring 11, the internal conductor 38 formed inside the via hole 30, the intermediate wiring 31, the internal conductor 8 filled into the via hole 10, the lower-layer wiring composed of the wiring body 6 and the etching barrier layer 5, and the bump 14. In the semiconductor package 49 of the present modification, the via holes 10 and 30 of the wiring board 23 have a barrel shape in which the cross-sectional area in the thickness direction is larger in the middle portion than at both ends. Aspects of the configuration and operation of the semiconductor package 49 of the present embodiment other than those described above are the same as in the semiconductor package of the previously described second embodiment.

In the semiconductor package 49 of the present embodiment, the insulating film has a two-layer structure composed of the board-insulating film 7 and the intermediate insulating film 37, and a wiring board 23 is used in which intermediate wiring 31 is provided between the insulating films. Therefore, the number of signals inputted to and outputted from the semiconductor device 15 can be increased in comparison to the semiconductor package of the aforementioned second embodiment. Effects in the semiconductor package 49 of the present embodiment other than those described above are the same as those of the semiconductor package of the aforementioned second embodiment.

Figure 14:
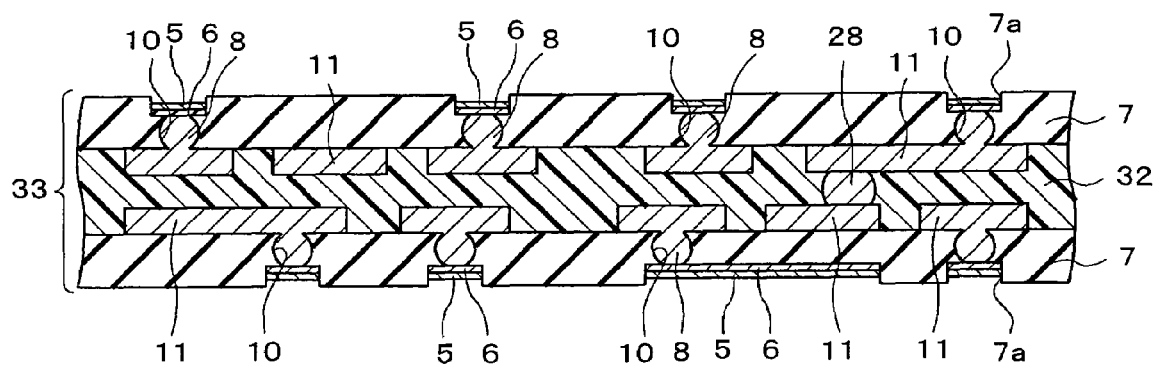
FIG. 14 is a sectional view showing the wiring board according to a fifth embodiment of the present invention.

The wiring board according to a fifth embodiment of the present invention will next be described. FIG. 14 is a sectional view showing the wiring board of the present embodiment. In FIG. 14, the same reference symbols are used to indicate constituent elements that are the same as those in the wiring board of the first embodiment shown in FIG. 4, and detailed description thereof is omitted. As shown in FIG. 14, in the wiring board 33 of the present embodiment, two of the wiring board 13 of the first embodiment shown in FIG. 4 are prepared, the wiring boards are layered so that the sides on which the upper-layer wiring 11 is formed face inward, and the respective upper-layer wirings 11 of the two wiring boards are connected to each other by a connection via 28 formed in a solder resist layer 32. Therefore, concave portions 7a are present on both the upper and lower faces in the wiring board 33 of the present embodiment. The via hole 10 and the connection via 28 in the wiring board 33 of the present embodiment have a barrel shape in which the cross-sectional area in the thickness direction is larger in the middle portion than at both ends. Aspects of the configuration of the wiring board 33 of the present embodiment other than those described above are the same as in the wiring board of the previously described first embodiment.

There are a total of four wiring layers in the wiring board 33 of the present embodiment, but since the manufacturing process is completed merely by adding a bonding step to the step for forming two wiring layers, this process is advantageous in terms of process yield and total cost compared to a wiring board in which all four layers are built up. Effects in the wiring board 33 of the present embodiment other than those described above are the same as those of the wiring board of the aforementioned first embodiment.

Figure 15A:
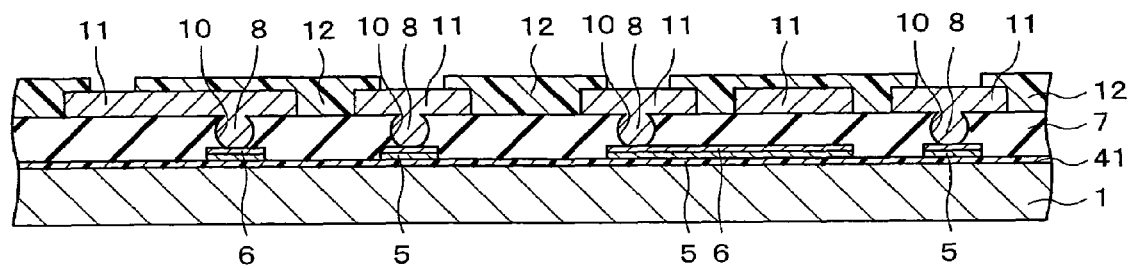
FIGS. 15A through 15C are sectional views showing the sequence of steps in the method for manufacturing a wiring board according to a sixth embodiment of the present invention.
Figure 15B:
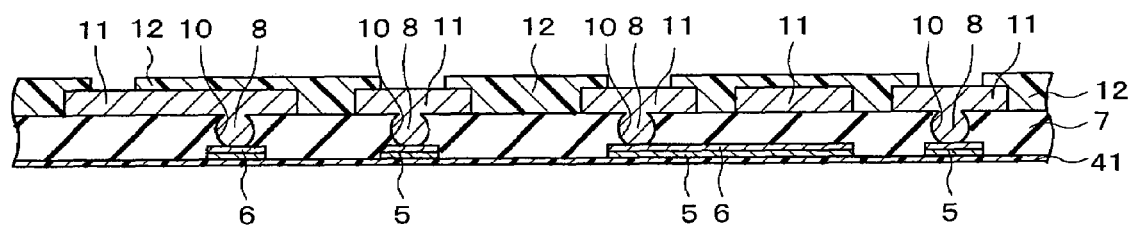
Figure 15C:
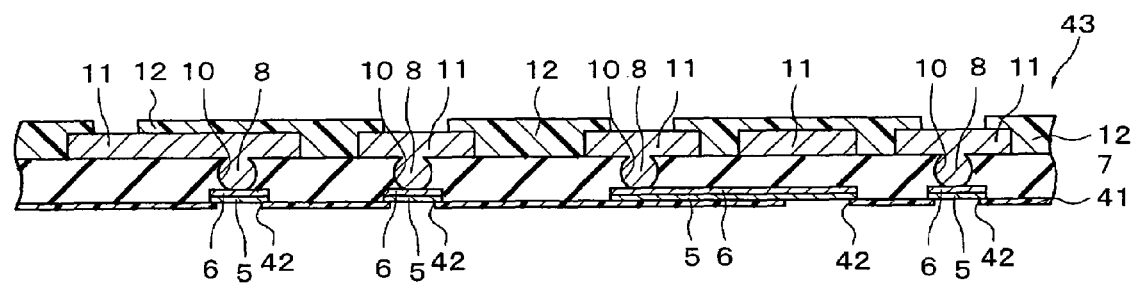

The wiring board according to a sixth embodiment of the present invention will next be described. FIGS. 15A through 15C are sectional views showing the sequence of steps in the method for manufacturing a wiring board according to the present embodiment. In FIGS. 15A through 15C, the same reference symbols are used to indicate constituent elements that are the same as those in the wiring board manufacturing method of the first embodiment shown in FIGS. 5 and 6, and detailed description thereof is omitted. As shown in FIG. 15C, the bottom face of the board-insulating film 7 and the surface of the etching barrier layer 5 are positioned in the same plane in the wiring board 43 of the present embodiment. A protective film 41 having a film thickness of 1 to 50 μm, for example, composed of epoxy resin or a polyimide, for example, is formed on the bottom face of the board-insulating film 7 and on the surface of the etching barrier layer 5. An open portion 42 is formed in this protective film 41, and the portion of the surface of the etching barrier layer 5 in the open portion 42 is exposed. Specifically, a protective film 41 is formed so that a portion of the etching barrier layer 5, i.e., the portion to which the bump is connected, is exposed, and the remaining area is covered on the bottom face of the wiring board 43 of the present embodiment.

The via hole 10 in the wiring board 43 of the present embodiment has a barrel shape in which the cross-sectional area in the thickness direction is larger in the middle portion than at both ends. Aspects of the configuration and operation in the wiring board 43 of the present embodiment other than those described above are the same as in the wiring board of the previously described first embodiment.

The wiring board 43 of the present embodiment may be manufactured by the method described below, for example. First, as shown in FIG. 15A, a protective film 41 that has a thickness of 1 to 50 µm, for example, and is composed of epoxy resin or a polyimide, for example, is formed on the entire surface of one face of a carrier board 1, and a resist pattern 2 is then formed on this protective film 41. The etching barrier layer 5, the wiring body 6, the board-insulating film 7, the via hole 10, the internal conductor 8, the upper-layer wiring 11, and the solder resist layer 12 are then formed by the same method as in the wiring board of the first embodiment shown in FIG. 5. A readily etchable layer is not formed at that time. Then, as shown in FIG. 15B, the carrier board 1 is removed by chemical etching, polishing, or another method. An open portion 42 is then formed in the protective film 41 by etching, and the etching barrier layer 5 is exposed, as shown in FIG. 15C.

In the wiring board 43 of the present embodiment, the protective film 41 is provided to the bottom face side on which the semiconductor device is mounted. Therefore, the adhesion between the wiring board 43 and the under-fill and other resin layers can be enhanced. Effects in the wiring board 43 of the present embodiment other than those described above are the same as those of the wiring board of the aforementioned first embodiment.

Figure 16:
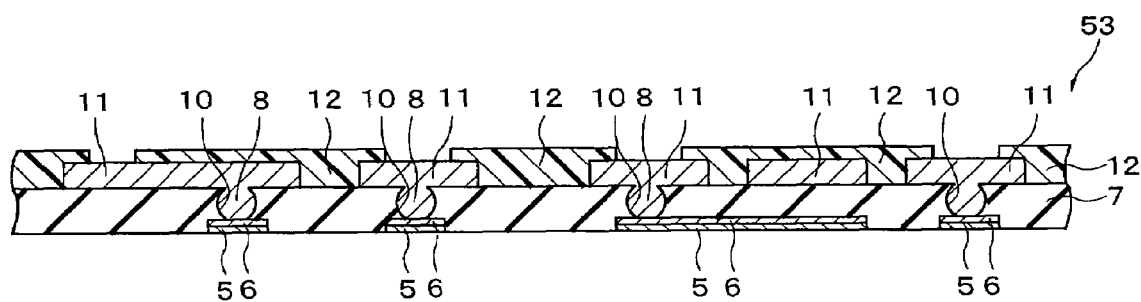
FIG. 16 is a sectional view showing the wiring board according to a seventh embodiment of the present invention.

The wiring board according to a seventh embodiment of the present invention will next be described. FIG. 16 is a sectional view showing the wiring board of the present embodiment. In FIG. 16, the same reference symbols are used to indicate constituent elements that are the same as those in the wiring board of the sixth embodiment shown in FIG. 15C, and detailed description thereof is omitted. As shown in FIG. 16, the wiring board 53 of the present embodiment differs from the wiring board 43 of the sixth embodiment shown in FIG. 15C in that the protective film 41 is omitted. The surface of the etching barrier layer 5 is also positioned in the same plane as the bottom face of the board-insulating film 7, rather than being recessed. The via hole 10 has a barrel shape in which the cross-sectional area in the thickness direction is larger in the middle portion than at both ends. Aspects of the configuration in the wiring board 53 of the present embodiment other than those described above are the same as in the wiring board of the previously described sixth embodiment.

Since the protective film 41 is not provided to the wiring board of the present embodiment, the manufacturing cost can be further reduced in comparison to the wiring board 43 of the sixth embodiment shown in FIG. 15C. The manufacturing cost can also be reduced in comparison to that of the wiring board 13 of the first embodiment shown in FIG. 4, because the step for forming the readily etchable layer 4 can be omitted. The wiring board of the present embodiment is particularly suitable from a cost perspective in cases in which the arrangement pitch of the semiconductor device electrodes is not particularly small, the arrangement density of the bumps is low, and precision in the positioning of the bumps is not particularly important; in cases in which the semiconductor device is not molded; or in cases in which the semiconductor device is molded but adhesion between the molding material and the wiring board is not particularly important. Effects in the wiring board of the present embodiment other than those described above are the same as those of the wiring board of the aforementioned first embodiment.

What is claimed is:

1. A wiring board comprising:
   a board-insulating film which has a thickness of 20 to 100 µm and in which a concave portion is formed on one face thereof;
   first wiring formed in said concave portion of said board-insulating film;
   second wiring formed on the other face of said board-insulating film;
   a via hole for connecting said second wiring and said first wiring formed on said board-insulating film to each other;
   the cross-section of said via hole in the thickness direction of said board-insulating film has a shape wherein widths of the shape on each end of the via hole are less than a width of the shape in a central portion of said via hole; and
   a 0.5 to 10 µm stepped portion being formed between an outer surface of said first wiring and the one face of said board-insulating film.

2. The wiring board according to claim 1, wherein,
   the connection interface of two wirings connected to each other through said via hole is in the center portion of said via hole in the thickness direction of said board-insulating film.

3. The wiring board according to claim 1, comprising:
   a solder resist layer formed on said second wiring and on the other face of said board-insulating film;
   an open portion provided to at least part of the portion of the solder resist layer that is formed on said second wiring; and
   the surface of said second wiring being exposed in said open portion.

4. The wiring board according to claim 1, comprising:
   a concave portion being formed also on the other face of said board-insulating film; and
   said second wiring being formed in this concave portion.

5. A semiconductor package comprising:
   the wiring board according to claim 1.

6. The semiconductor package according to claim 5, comprising:
   said semiconductor device being connected to the first wiring of said wiring board.

7. The semiconductor package according to claim 5, comprising:
   said semiconductor device being connected to the second wiring of said wiring board.

8. The semiconductor package according to claim 5, further comprising a connection terminal connected to an external element or to said first wiring or said second wiring.

9. The wiring board according to claim 1, wherein the conductive material inside the via is copper.

10. The wiring board according to claim 1, wherein the cross-section of a via hole in the thickness direction of a board-insulating film is barrel-shaped.

11. The wiring board according to claim 1, wherein,
    said board-insulating film has a layered structure in which a plurality of insulating films are layered;
    intermediate wiring is formed between each of said insulating films; and
    the wirings formed in the upper layer and the lower layer of said insulating films is connected to each other by the via hole formed in said insulating films.

* * * * *